(12) United States Patent
Slenker (10) Patent No.: US 6,344,781 B1
(45) Date of Patent: Feb. 5, 2002

(54) BROADBAND MICROWAVE CHOKE AND A NON-CONDUCTIVE CARRIER THEREFOR

(76) Inventor: Stephen Amram Slenker, 10 Crabapple La., Chelmsford, MA (US) 01824

( * ) Notice: Subject to any disclaimer, the term of this patent is extended or adjusted under 35 U.S.C. 154(b) by 0 days.

(21) Appl. No.: 09/834,526

(22) Filed: Apr. 14, 2001

Related U.S. Application Data (63) Continuation-in-part of application No. 09/660,339, filed on Sep. 14, 2000, now Pat. No. 6,236,289.

(51) Int. Cl.[7] .......................... H01F 27/06; H01F 27/30; H01F 27/24; H05K 5/02; H03H 7/00
(52) U.S. Cl. ........................ 333/181; 333/185; 336/65; 336/92; 336/221; 336/231; 336/233; 361/736; 361/743; 361/760; 361/768; 174/52.1; 174/52.2
(58) Field of Search .................................. 333/181, 185; 336/15, 65, 67, 92, 98, 177, 231, 233, 221; 361/736, 743, 752, 760, 768, 772; 174/52.1, 52.2

(56) References Cited

U.S. PATENT DOCUMENTS

| | | | | |
|---|---|---|---|---|
| 2,351,604 A | * | 6/1944 | Ferrill, Jr. | 336/180 |
| 2,442,776 A | * | 6/1948 | Newkirk | 336/205 |
| 2,547,412 A | * | 4/1951 | Salisbury | 455/325 |
| 3,076,947 A | * | 2/1963 | Davidson, Jr. | 333/181 |
| 3,812,438 A | * | 5/1974 | Hopfer | 333/246 |
| 4,236,127 A | * | 11/1980 | Scherba | 333/175 |
| 5,253,145 A | * | 10/1993 | Lint | 361/400 |
| 5,805,431 A | * | 9/1998 | Joshi et al. | 361/836 |
| 5,838,215 A | * | 11/1998 | Gu et al. | 333/181 |
| 6,094,110 A | * | 7/2000 | Reddy | 333/181 |
| 6,236,289 B1 | * | 5/2001 | Slenker | 333/181 |

FOREIGN PATENT DOCUMENTS

| | | | | |
|---|---|---|---|---|
| DE | 36 02 759 A1 | * | 8/1987 | |
| JP | 5-299252 | * | 11/1993 | 361/118 |
| JP | 8-288147 | * | 11/1996 | |
| JP | 9-55320 | * | 2/1997 | |

* cited by examiner

Primary Examiner—Robert Pascal
Assistant Examiner—Barbara Summons
(74) Attorney, Agent, or Firm—John V. Stewart (57) ABSTRACT

An electrically conductive wire wound into a conical coil 1 with leads from the small and large ends of the coil. The coil is filled with fine-grained magnetic material 11, and is mounted in a thin-walled, electrically non-conductive carrier 21 designed for precise automated assembly onto a circuit board 15. The wire leads are plastic-welded onto the carrier, and no metallic pads are used, greatly increasing the effective bandwidth of the choke. The small end 4 of the coil is positioned precisely on a micro-strip 17 on the circuit board. Attachment of the wire lead from the small end of the coil to the microstrip is done with minimum lead length and minimum conductive material for the highest possible frequency response. Precise coil positioning, minimal lead length, and a totally non-conductive carrier virtually eliminates electrical reflections and resonances to yield a broadband choke with exceptional frequency range.

13 Claims, 5 Drawing Sheets

BROADBAND MICROWAVE CHOKE AND A NON-CONDUCTIVE CARRIER THEREFOR

CROSS-REFERENCE TO RELATED APPLICATIONS

This application is a continuation-in-part of U.S. patent application Ser. No. 09/660,339, filed Sep. 14, 2000, now U.S. Pat. No. 6,236,289.

BACKGROUND OF THE INVENTION

1. Field of the Invention

This invention relates to microwave chokes for power supplies in electronic amplifiers, signal generators, and filters.

2. Description of Prior Art

Microwave chokes are used to block microwave energy from power supplies in amplifiers, signal generators, and filters. Laser drivers for fiber optic cables also require chokes between their power sources and the lasers. Broadband active filters require broadband chokes. If microwave energy leaks into a power supply, the powered device will not function properly. Microwave chokes typically operate within a narrow band of operating frequencies. However, the fiber optic cables now used in cable television and internet communication typically have extremely large band widths and require amplifiers which will amplify signals for all of the frequencies being transmitted over these cables.

In order to cover the broad spectrum of frequencies, multiple narrow band amplifiers are usually employed, each covering a small segment of the frequency range. These amplifiers are operated in parallel. All of the devices used in these amplifiers would generally function over the entire frequency range except for the chokes. If a broadband choke were available, a single broadband amplifier could replace several narrow-band amplifiers.

Until recently, the highest operating frequency of available broadband chokes was only 3 or 4 GHz. These chokes generally had a conventional geometry such as a solenoid or a toroid, and used an air, iron, or ferrite core. Beyond this frequency range, multiple small solenoids were typically used, but these devices have a narrow frequency range of about 10% of the center frequency of operation.

Prior leadless carriers for broadband chokes used a ceramic substrate material with wraparound connections. However, such a carrier design introduces the dielectric properties of the carrier into the performance of the choke. Additionally the prior carriers have metallic pads for connection of the leads, and these pads add substantial capacitance and dielectric losses. This prior carrier design is marginally useable up to 8 GHz with the new broadband conic inductor described herein. However, high frequency performance requires a different approach to the leadless carrier.

SUMMARY OF THE INVENTION

The objectives of the present invention are provision of a wideband microwave choke that attenuates electrical signals in frequencies from 300 kHz to 40 GHz with a substantially flat frequency response in this range, or in a band chosen by design within this range, has a protective, totally non-conductive carrier that assists in precise positioning and bonding of the choke to a miniature conductor strip on a circuit board, takes minimal space along the conductor strip, enables fully automated positioning and mounting of the choke on a circuit board by machine, and provides frequency response equal to the choke without a carrier, in a more convenient and easily mountable leadless carrier.

The objectives of the present invention are achieved by a thin, electrically conductive wire 2 wound into a single-layered hollow conic coil 1, having a small end 4 and a large end 5. The coil is mounted in a thin-walled carrier 21 of insulating material such as plastic, with no metallic parts. The carrier holds the coil at an optimum orientation relative to the mounting surface of a circuit board to minimize electromagnetic reflections and resonance that would degrade microwave performance. The small end of the coil 4 is positioned adjacent a contact strip 17 on the circuit board. The wire lead 2 exits tangentially from the small end of the coil and is bonded directly to the contact strip without intermediate metallic pads. An optional cylindrical extension 6 on the large end of the coil provides increased low frequency inductance. The wide range of small to large diameters of coil windings, and careful elimination of sources of electromagnetic interference, reflections, and resonance, provides an inductor that blocks a broad band of radio frequency energy while providing a direct current to pass through the coil unattenuated.

REFERENCE NUMBERS

D. Displacement of large end of coil from mounting plane of carrier
1. Wire coil or inductor
2. First lead of coil
3. Second lead of coil
4. Small end of coil
5. Large end of coil
6. Cylindrical extension of coil
7. Bonding of first lead to micro-strip center conductor on circuit board 11. Powdered iron or other fine-grained magnetic material
12. Ferrite
15. Substrate of circuit board
16. Ground plate of circuit board
17. Micro-strip contact of circuit board
18. Ground electrode of circuit board
21. Carrier
22. First wall of carrier
23. Holding portion for first lead
24. Plastic weld for holding lead
25. Outrigger for first lead
26. Holding portion for second lead
27. Adhesive stripe for fixing coil to carrier
28. Mounting plane of carrier
29. Second wall of carrier
30. Coil positioning gap
31. Stub of outrigger after removal
32. Carrier mounting epoxy

TERMINOLOGY

Mounting plane of carrier

This is the plane of the electrical contact surfaces on which the carrier is mounted. The mounting plane of the carrier is not necessarily enclosed by the carrier, but may be defined by a common cut-off plane along the bottom of the wall or walls of the carrier.

Hot

The small end of the coil is the high-frequency, or "hot", end of the coil. Thus, the "hot" lead is the first lead, or the lead from the small end of the coil. The "cold" or grounded end is the large end of the coil.

DETAILED DESCRIPTION

A microwave choke is a coil of electrically conductive wire that prevents radio frequency energy from passing through it over a range of frequencies. The invention is a microwave choke with flat performance to less than 0.15 DB maximum insertion loss and over 20 DB of return loss from 300 kHz to 40 GHz. The choke is usable above 40 GHz. It utilizes a plastic enclosure or carrier that does not substantially degrade its electrical performance. It is easily handled and positioned with automatic equipment for accurate placement, resulting in optimum performance.

The device uses specially prepared insulated wire with the insulation removed at the ends. The lead 2 at the small end 4 of the coil should be free of insulation to within a distance from the first winding of the coil of no greater than twice the inner diameter of the small end of the coil. Alternately, the lead 2 should be free of insulation to within a distance from the first winding of the coil of no greater than 0.020". Minimal lead lengths greatly improve high frequency operation. Only the uninsulated ends or leads 2 and 3 of the wire are plated with tin, solder, or preferably gold. Gold plating has a nickel under-plate to prevent copper migration through the gold. Gold plating permits the leads to be either gap welded or thermosonically wire bonded to gold pads in addition to other bonding methods, such as reflow soldering and conductive epoxy bonding.

The use of plating only on the leads of the wire permits the main body of the inductor to have the extra strength and lower skin resistance of copper while permitting the leads to be bonded using exotic materials such as gold or special epoxies. This gives superior performance over fully gold plated and insulated copper wire and is more economical to manufacture.

The carriers shown herein permit the choke to be fully automatically positioned with extreme accuracy onto a micro-strip line. The embodiment of FIGS. 7–12 allows installation by reflow soldering or by the use of conductive epoxy on both leads 2 and 3, but this design has a somewhat reduced frequency response. The reduced response is caused by excessive material present on the small end and an extension of the hot lead along a plane perpendicular to the mounting plane.

Figure 1:
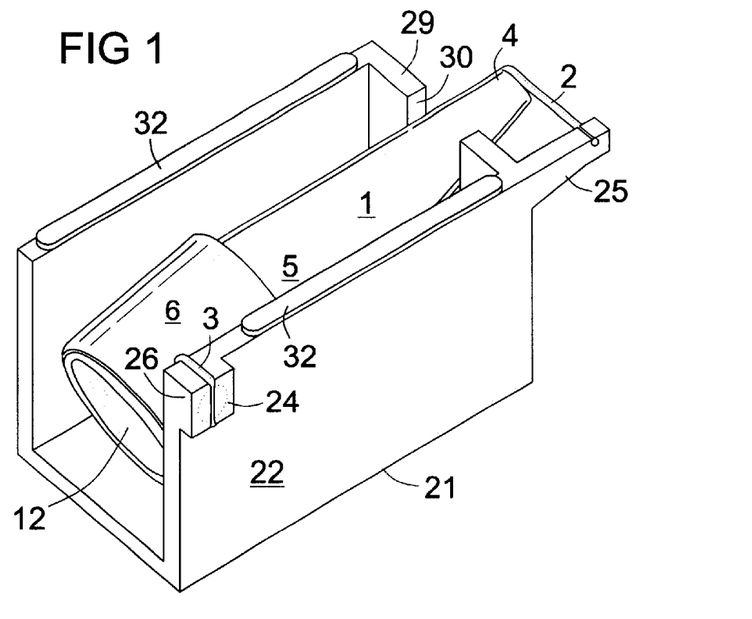
FIG. 1 is a perspective bottom/right/back view of the choke in a preferred embodiment using a conic coil with a cylindrical extension.
Figure 2:
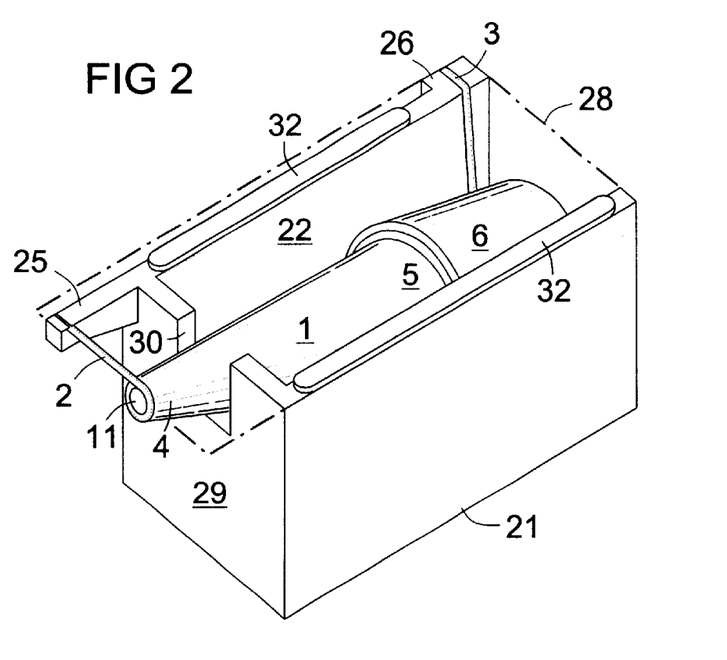
FIG. 2 is a perspective bottom/left/front view of the choke of FIG. 1.
Figure 3:
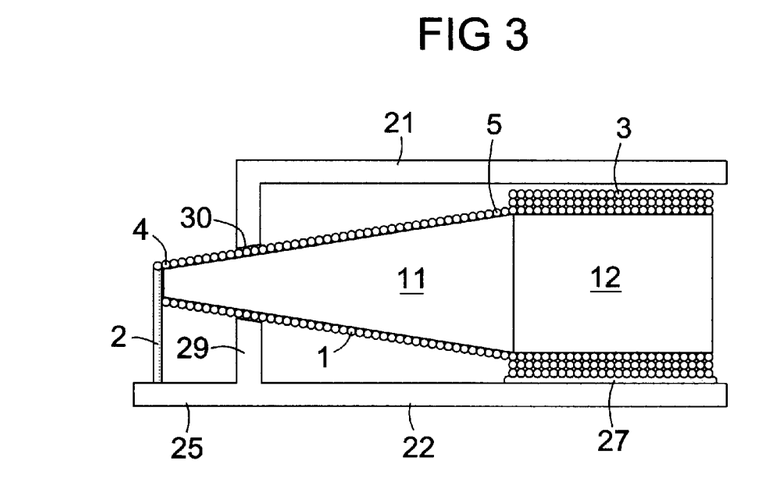
FIG. 3 is a top sectional view of the choke of FIG. 1 taken along the coil axis.
Figure 4:
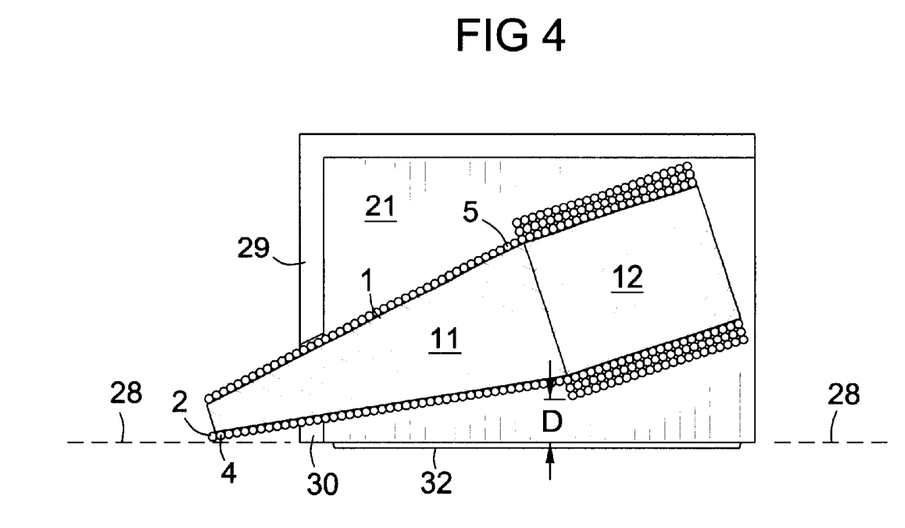
FIG. 4 is a right side sectional view of the choke of FIG. 1 taken along the coil axis.
Figure 5:
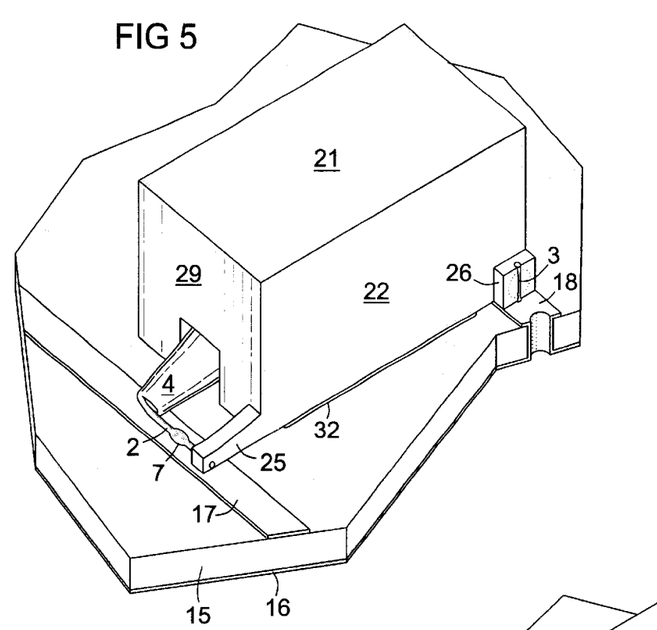
FIG. 5 is a perspective top/right/front view of the choke of FIG. 1 mounted on a circuit board.
Figure 6:
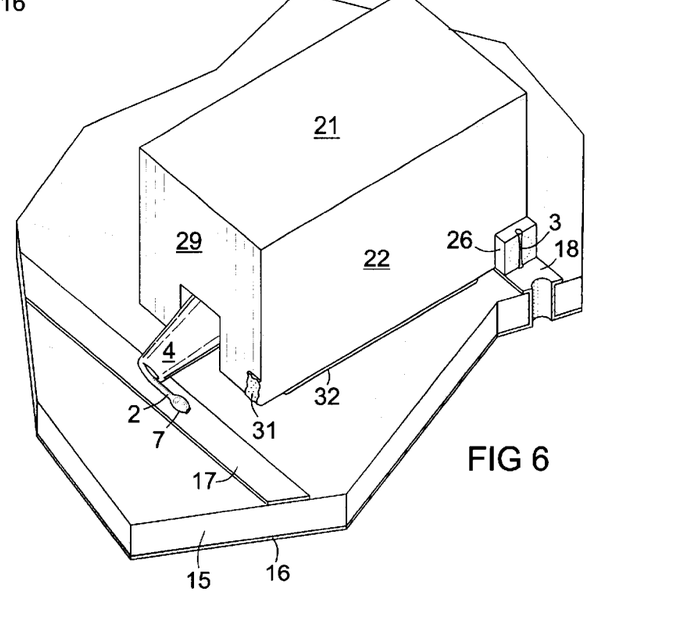
FIG. 6 is a view of FIG. 5, with the outrigger removed.
Figures 7, 8:
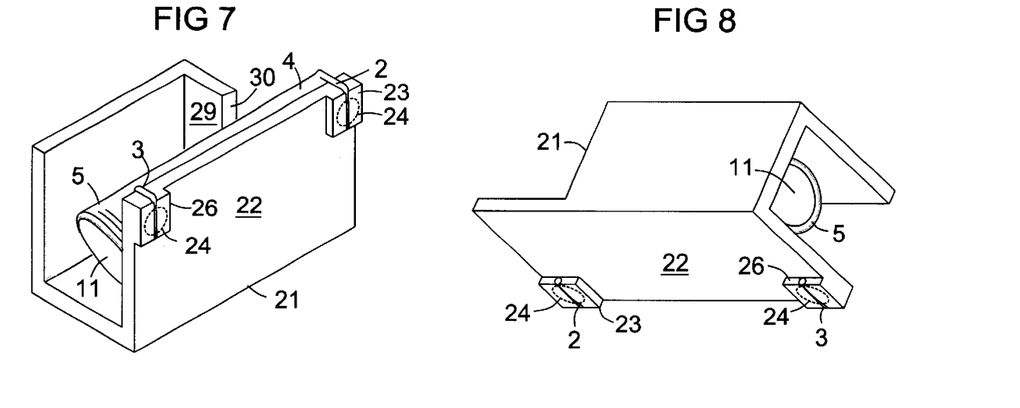
FIG. 7 is a perspective bottom/right/back view of a second embodiment of the choke with a simple conic coil.
FIG. 8 is a perspective top/right/back view of the choke of FIG. 7.
Figure 9:
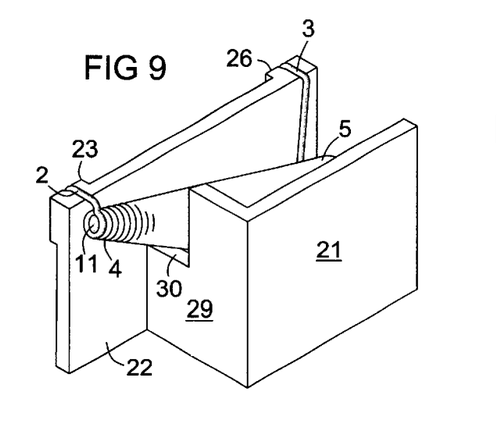
FIG. 9 is a perspective bottom/front/left view of the choke of FIG. 7.
Figure 10:
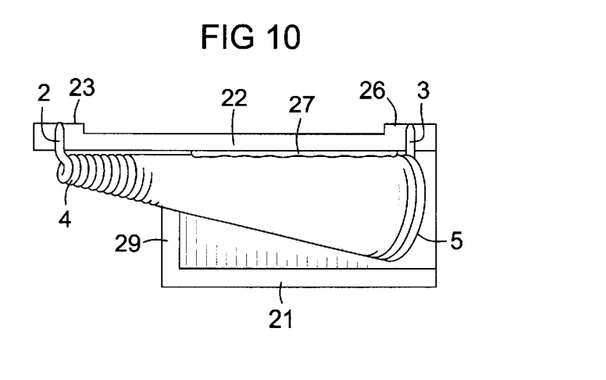
FIG. 10 is a bottom view of the choke of FIG. 7.
Figure 11:
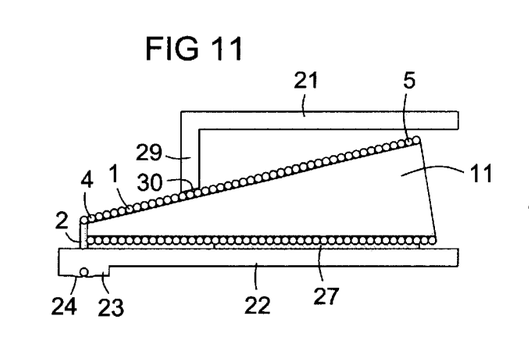
FIG. 11 is a top sectional view of the choke of FIG. 7 along the axis of the coil.
Figure 12:
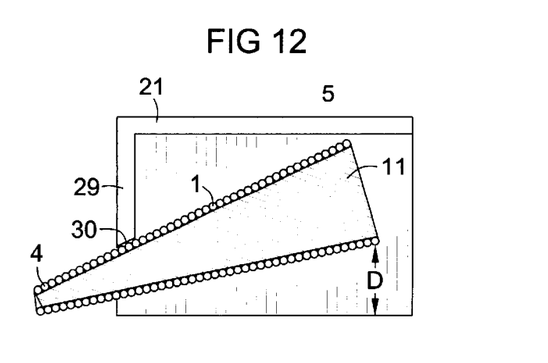
FIG. 12 is a right side sectional view of the choke of FIG. 7 along the axis of the coil.
Figure 13:
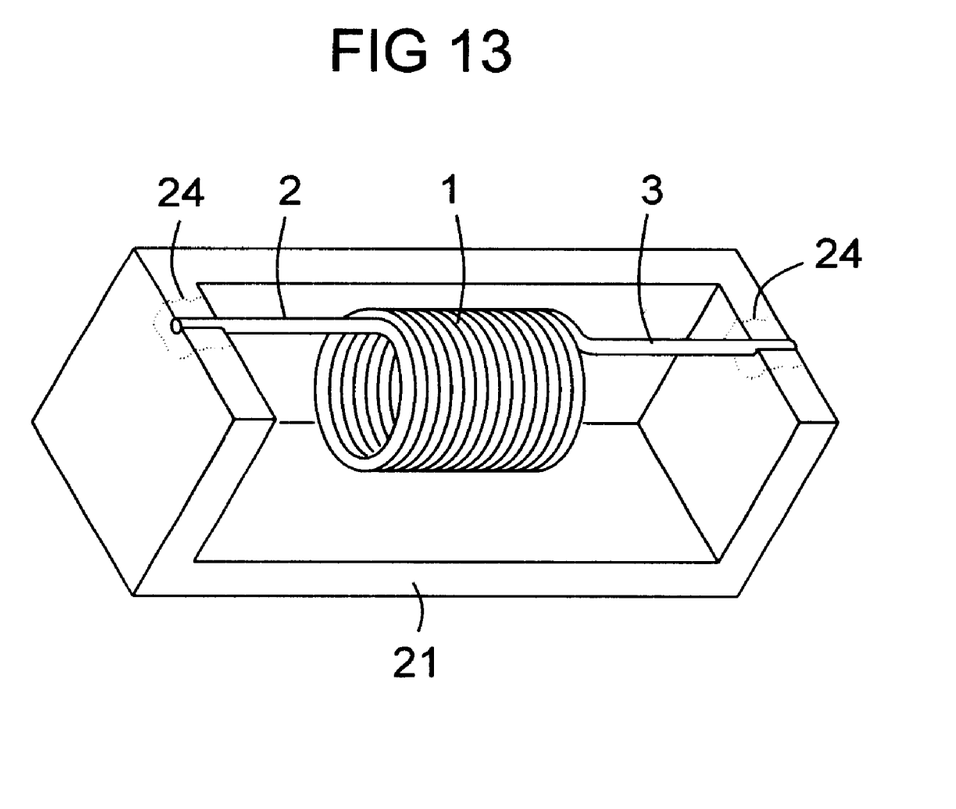
FIG. 13 is a perspective view of a solenoid choke mounted in a carrier with no electrically conductive material, with the choke lead unobstructed adjacent the coil for direct electrical bonding to circuit board contacts.

The carrier of FIG. 13 holds both leads 2 and 3 in an unobstructed span adjacent the coil for direct bonding of both leads to respective contacts on a circuit board without intermediate metallic pads. The unobstructed span of each lead is insulation free.

The preferred embodiment of FIGS. 1–6 allows installation of the low potential end 3 by reflow soldering or conductive epoxy but permits the high potential end 2 to be attached by gap welding or ultrasonic bonding. All excess material applied to the high potential end is eliminated when this end is bonded without the use of solder or epoxy.

The carrier 21 is preferably made of high-temperature thermoplastic with low radio frequency loss that is resistant to solder heat. The presently preferred material is liquid crystal polymer (LCP) with a melting point of about 750 degrees Fahrenheit. The coil 1 is attached inside the enclosure by a stripe of epoxy 27, or may be suspended by the leads as in FIG. 13. The epoxy stripe does not extend to the small end 4 of a conical inductor, which is electrically sensitive. The epoxy stripe should not approach the first winding of a conical coil to within a distance of three inner diameters of the small end of the coil, preferably greater. This end of the coil is free of excess material of any type, since any excess material near this end will degrade performance.

The leads 2 and 3 are precisely positioned on the carrier by grooves in lead-holding areas 23 and 26 on the carrier, and are then plastic-welded into position. The carrier plastic is deformed and surrounds the leads by a heated spot welding tip that locks the lead within the plastic 24. This eliminates the need for any metallic parts on the carrier.

The carrier preferably has an asymmetric shape with a flat top. This enables orientation by a vibratory feed mechanism that presents a properly oriented choke to a vacuum pickup for positioning. The vacuum pickup places the choke in its exact final location on a circuit. This process is referenced in the electronic industry as "pick and place". The carrier dimensions preferably are repeatable to better than 0.0005 inch by fabrication in a high precision mold. High carrier accuracy allows the chokes to be positioned to plus or minus 0.001", which is often necessary for repeatable performance. The carrier walls are preferably about 0.007 inch thick, which is about twice as thick as a sheet of paper. Alternately, the carrier preferably has a typical wall thickness no greater than the interior diameter of the small end of the coil.

The carrier supports the inductor, and preferably positions it at an oblique angle to the mounting plane 28 of the carrier, and thus to the micro-strip line 17 when installed. This angle should be such that the circumference of the small end 4 of the coil is nearly tangent to the mounting plane 28 of the carrier. The small end of the coil should preferably be separated from the mounting plane of the carrier by less than ½ of the inner radius of the small end of the coil. The first lead 2 should preferably reach the mounting plane of the carrier within a distance from the first winding of less than one radius of the small end of the coil. The large end of the coil 5 should preferably be separated from the mounting plane by a distance D of at least half the radius of the large end of the coil. Angling the coil relative to the mounting plane reduces stray capacitance, providing controlled and repeatable optimum performance. The carrier preferably provides an unobstructed span of at least the hot lead 2 adjacent to the coil along the mounting plane, so this lead can be electrically bonded directly to a contact on a circuit board.

The leads are placed so they are underneath the outside edges of the enclosure and are secured by plastic welding, either to an outside wall of the enclosure or to a bottom edge of the enclosure. This unique geometry minimizes the dielectric loss effect of the enclosure material on the electrical characteristics of the coil. Conventional components have a metallic pad on a top surface of a carrier or enclosure, and leads are attached to this pad. This causes dielectric properties of the carrier to reduce the performance of the component, and causes excessive stray capacitance inherent in the large area geometry of a conventional contact pad. On some components, a lead is attached to a bottom surface of a pad, but the pad is generally large and introduces considerable stray capacitance and dielectric loss. The ultra thin walls of the present carrier have negligible mass and negligible stray effects. The total absence of a conventional metal bonding pad eliminates stray effects associated with conventional designs. Since the ends of the leads in the present design are plastic-welded into the walls of the carrier, no conductive material is added to make a large bonding pad. The wire is thus bonded to the micro strip with less than one tenth of the area of the smallest conventional bonding pad. The first lead 2 is preferably bonded to the micro strip at a distance from the first winding of the coil no greater than twice the inner diameter of the small end of the coil. Alternately, the first lead 2 is preferably bonded to the micro strip at no more than 0.020 inch from the small end of the coil. Closer bonding distance is better for high frequency response.

The carrier is preferably made of thermoplastic with a melting point above 600 degrees Fahrenheit, which is higher than the melting point of solder. Tiny solder balls mixed with flux are commonly known as "solder paste". Drops of solder paste can be automatically deposited on contact points on a circuit board where the choke leads are to be bonded. The carrier is then placed on the circuit board with the choke leads in the respective drops. A carrier with a flat top allows vacuum pickup and precise placement on a circuit board by automated equipment. The contacts on the circuit board are then heated to the melting point of solder to bond the leads directly to the contacts on the circuit board close to the coil.

Each of the following features individually improves the usable frequency range of a microwave choke. These features can be beneficially used in various combinations, some of which extend the useable frequency range by several orders of magnitude over existing chokes.

1. The use of a conic coil that is critically placed on a micro-strip.
2. The small end of the conic coil having an extremely small diameter.
3. The use of a magnetic filler material with sub-micron grain size and low magnetic coercivity.
4. The placement of this filler so that it does not extend externally beyond the small first winding of the coil.
5. The absence of magnetic material on the outside of the small end of the coil.
6. The removal of insulation from the wire very close to the small end of the coil so that the lead length is minimal for the highest frequency operation.
7. Placement of the fine wire lead on the small end of the coil along the exact center of the micro-strip with no extra mass of connection that would add stray capacitance and discontinuity effects due to a geometry change in the conductor.
8. Adding a cylindrical extension to the large end of the coil for extended low frequency response.
9. Mounting the coil in a carrier made entirely of electrically non-conductive material, such as high-temperature plastic, with the ends of the leads directly fixed to the carrier without metallic pads or solder.

The wire lead 2 is preferably bonded to the micro-strip 17 by gap welding, which adds no extra material to cause abrupt geometry changes that result in standing waves. Gap welding fuses the gold plated wire lead 2 into the metal of the micro-strip 17 without additional bonding material, thus providing reduced bond size and a smoother transition. Additionally, it provides a gold-to-gold bond, which is more reliable and withstands higher temperatures than other bonds. The micro-strip 17 typically has a 0.010" wide trace on top of a dielectric substrate 15 with a conductive ground plate 16 on the bottom of the substrate. Conventional components contain metallic bonding pads that are typically at least 0.010" square and do not align perfectly with the micro-strip. This results in reflections of energy and reduced performance over the frequency range. The carrier is secured to the circuit board with non-conductive epoxy 32 in areas away from the leads.

Low frequency response of a hollow conic coil is improved by inserting a core of magnetic material, such as ferrite. However, this can reduce the high-frequency response. High-frequency response is best maintained if the magnetic material is fine-grained and not easily permanently magnetized. The grain size is preferably 1 micron or smaller. This small grain size can currently be produced in both powdered iron and ferrite. Powdered iron is preferred because ferrite tends to retain permanent magnetism. So-called "soft" ferrites retain less magnetism than "hard" ferrites. Soft ferrites are preferred if ferrite is used.

The low frequency range of the choke can be extended by providing a cylindrical extension 6 integrally formed on the large end of the conic inductor. This extension is filled with a ferrite rod. Plural layers of wire are wound directly over the ferrite portion of the core. This technique substantially increases the overall inductance in the low frequency range, but does not reduce the effectiveness of the device at high microwave frequencies. In all prior inductive choke designs, increasing the inductance causes degradation in performance at high frequencies. A coiled wire shell with one end in a conic shape and the other in a cylindrical shape produces a broadband choke with relatively flat frequency response characteristics.

Since the cylindrical extension does not require fine-grained material, a less expensive ferrite with a grain size such as 5 microns can be used. Thus, the conic portion of the coil can have a different core material than the cylindrical extension. This provides design options to maximize bandwidth and minimize cost, depending on the available production cost of a different core for each section of the choke versus a single core for both sections from fine-grained magnetic material.

A difficulty with fabricating and handling microwave chokes is that they use very fine wire. The wire can be finer than a human hair, or from about 0.0008 to 0.0015 inch in diameter. This makes them extremely fragile. It is difficult to place the device accurately in a circuit. However, placement is critical to optimum performance. A placement error of 0.001 inch will cause a measurable degradation in performance. Automatic precise placement is enabled with the carrier design as previously described.

The main design considerations for which geometry of the choke should be selected are 1) the physical size limitations of the choke; and 2) the current carrying capacity requirements. There are tradeoffs in construction. Current carrying capacity is determined by the wire diameter, but larger wire makes the device physically larger and reduces its high frequency range. Reducing the diameter of the small end of the coil causes the choke to block higher frequencies. Raising inductance at the large end of the coil by including a cylindrical portion improves blocking of lower frequencies.

For example, a choke with #36 gauge (AWG) wire provides about 600 ma current capacity. If the small end of the coil is 0.016" I.D., the choke will operate up to about 12 GHz. This choke can be mounted flat against a circuit board without significant performance loss.

A choke with #47 gauge (AWG) wire provides about 100 ma current capacity. If the small end of the coil is 0.005" I.D., the choke operates up to about 40 GHz if the first lead is directly bonded to the respective contact on the circuit board within 0.005" of the first winding of the small end of the coil. If the bonding distance is 0.010", the choke operates up to about 35 GHz. If the bonding distance is 0.020", the choke operates up to about 31 GHz. The large end of the coil should be separated by a distance D from the mounting plane of the circuit board as described below.

A choke with #47 gauge (AWG) wire, and a small end of the coil of 0.003" I.D., operates up to about 60 GHz if the first lead is directly bonded to the respective contact on the circuit board within 0.005" of the first winding of the small end of the coil. If the bonding distance is 0.010" the choke operates up to about 40 GHz. If the bonding distance is 0.020" the choke operates up to about 33 GHz. The large end of the coil should be separated by a distance D from the mounting plane of the circuit board as described below.

The angle of the coil relative to the surface of the circuit board effects the high frequency performance of the choke. Up to 12 GHz the coil can rest on the circuit board with little effect. Above 12 GHz the high frequency response improves if the coil is set at an angle to the circuit board. This is accomplished by mounting the large end of the coil above the mounting plane 28 of the carrier by a distance D of at least half the inner radius of the large end of the coil or more, depending on physical space available and bandwidth desired.

The cylindrical part of the coil preferably has 3 layers. This provides high inductance in a shorter cylindrical coil length as compared to a single layer. Preferably the cylindrical extension is approximately half the length of the conic coil. The use of two layers in the cylindrical extension is not recommended, because it lowers the self-resonant frequency of the coil. Any odd number of layers from 3 and up are best. Use of multiple layers on the small end of the coil is not recommended because it reduces the high frequency response.

It has been previously impossible to use a leadless carrier for many types of microwave circuits because the carrier took valuable space on the center of the micro-strip required by adjacent components. Additionally, degradation in microwave performance resulted from the use of prior carrier geometries. This can be solved by providing a removable outrigger 28 that holds the lead 2 from the small end 4 of the coil for precise placement with gap welding.

After conductively bonding the leads 2 and 3 to the circuit board contacts 17 and 18 respectively, the outrigger 25 can be snapped off. If the conductive weld 7 of the first lead 2 to the micro-strip is made properly, the wire breaks just beyond the weld (FIGS. 5 and 6), leaving the weld intact. Removing the outrigger eliminates stray electromagnetic effects caused by it and the extension of the wire beyond the weld to the outrigger. The outrigger can be snapped off with tweezers using a twisting motion, and the wire will break off just beyond the weld. In microelectronic component assembly it is a customary procedure to pull off the "pigtail" (wire extending beyond a weld) since pulling of the pigtail is the most common test for a good weld. By removing the outrigger and pulling the excess wire off, the integrity of the weld is tested while simultaneously improving the microwave performance of the device. Additionally, the valuable space occupied by the outrigger can then be used for mounting other components on the micro-strip.

The carrier is shown as box-like, but it can optionally be other shapes, including smoothly curved shapes. It can have flat sides angled to follow the conic sides of the coil, appearing trapezoidal in a top view. In any case, it preferably has at least a flat top and an asymmetric shape to enable automatic handling.

Although the present invention has been described herein with respect to preferred embodiments, it will be understood that the foregoing description is intended to be illustrative, not restrictive. Modifications of the present invention will occur to those skilled in the art. All such modifications that fall within the scope of the appended claims are intended to be within the scope and spirit of the present invention.

I claim:

1. A microwave choke comprising:
    an electrically conductive wire having first and second ends;
    the wire wound into a hollow conic coil, the coil having a small end and a large end, a first winding of the wire at the small end of the coil, the small and large ends of the coil having inner and outer diameters and radii;
    the first and second ends of the wire extending as first and second leads from the small and large ends of the coil respectively;
    a coating of electrical insulation on the wire except on the leads;
    the first lead being free of insulation to within a distance from the first winding of the coil of no greater than 0.020 inches;
    the coil filled with a core of magnetic material; and,
    the core not extending externally from the small end of the coil.

2. The microwave choke of claim 1, wherein the first and second leads of the coil are bonded directly to respective conductive contacts on a circuit board without the use of intermediate metallic pads.

3. The microwave choke of claim 1, further comprising:
    a carrier made entirely of electrically non-conductive material;
    the first and second ends of the wire fixed directly to the carrier by non-metallic means; and,
    a length of at least the first lead is unobstructed between the respective end of the wire and the respective end of the coil to allow soldering of the lead directly to a respective contact on a circuit board.

4. The microwave choke of claim 3, wherein the first and second leads of the coil are bonded directly to respective conductive contacts on a circuit board without the use of intermediate metallic pads.

5. The microwave choke of claim 3, wherein first and second drops of solder paste are placed on respective electrically conductive contacts on a circuit board in the relative positions of the first and second leads, the carrier is placed on the circuit board with the first and second leads in the respective drops of solder paste, and the respective contacts are heated to the melting point of the solder to bond the leads directly to the contacts on the circuit board.

6. A microwave choke comprising:

an electrically conductive wire having first and second ends;

the wire wound into a hollow coil having first and second ends;

the first and second ends of the wire extending as first and second leads from the first and second ends of the coil respectively;

a coating of electrical insulation on the wire except on the leads;

a carrier made entirely of electrically non-conductive material; and, the first and second ends of the wire fixed directly to the carrier by non-metallic means;

a length of at least the first lead being unobstructed between the respective end of the wire and the respective end of the coil to allow electrical bonding of the lead directly to a respective contact on a circuit board.

7. The microwave choke of claim 6, wherein at least the first end of the wire is fixed to the carrier by thermally reflowing the carrier material around the end of the wire so the end of the wire is embedded in the carrier material.

8. The microwave choke of claim 6, wherein the first and second leads of the coil are bonded directly to respective conductive surfaces on a circuit board without the use of intermediate metallic pads.

9. The microwave choke of claim 6, wherein first and second drops of solder paste are placed on respective electrically conductive contacts on a circuit board in the relative positions of the first and second leads, the carrier is placed on the circuit board with the first and second leads in the respective drops of solder paste, and the respective circuit board contacts are heated to the melting point of the solder to bond the leads directly to the contacts.

10. An electronics component packaged for automated mounting on a circuit board, comprising:

an electronics component having first and second leads, each lead having an end;

a carrier made entirely of electrically non-conductive material;

the ends of the first and second leads fixed directly to the carrier by non-metallic means; and a length of at least the first lead being unobstructed between the end of the lead and the electronics component to allow electrical bonding of the lead directly to a respective contact on a circuit board.

11. The electronics component of claim 10, wherein at least the end of the first lead is fixed to the carrier by thermally reflowing the carrier material around the end of the lead so the end of the lead is embedded in the carrier material.

12. The electronics component of claim 10, wherein the first and second leads are bonded directly to respective conductive surfaces on a circuit board without the use of intermediate metallic pads.

13. The electronics component of claim 10, wherein first and second drops of solder paste are placed on respective electrically conductive contacts on a circuit board in the relative positions of the first and second leads, the carrier is placed on the circuit board with the first and second leads in the respective drops of solder paste, and the respective circuit board contacts are heated to the melting point of the solder to bond the leads directly to the contacts.

* * * * *